United States Patent [19]

Kagayama et al.

[11] Patent Number: 4,819,024
[45] Date of Patent: Apr. 4, 1989

[54] IMAGE-FORMING APPARATUS HAVING SHEARING DEVICE FOR CUTTING IMAGE-WISE EXPOSED PHOTOSENSITIVE WEB

[75] Inventors: Shigeru Kagayama; Morikazu Iwase, both of Nagoya, Japan

[73] Assignee: Brother Kogyo Kabushiki Kaisha, Aichi, Japan

[21] Appl. No.: 119,583

[22] Filed: Nov. 10, 1987

[30] Foreign Application Priority Data

Nov. 14, 1986 [JP] Japan .................... 61-175746[U]
Jun. 9, 1987 [JP] Japan .................... 62-143481

[51] Int. Cl.4 ............................................. G03G 15/00
[52] U.S. Cl. .................................... 355/14 R; 355/13; 355/28; 355/29; 355/64
[58] Field of Search ............... 355/13, 16, 3 R, 14 R, 355/28, 29, 64, 65

[56] References Cited

U.S. PATENT DOCUMENTS

| | | | |
|---|---|---|---|
| 4,175,850 | 11/1979 | Bujese | 355/13 |
| 4,193,330 | 3/1980 | Knox | 355/13 X |
| 4,444,485 | 4/1984 | Kogane | 355/29 |
| 4,457,617 | 7/1984 | Tolmie | 355/13 |

Primary Examiner—R. L. Moses
Attorney, Agent, or Firm—Parkhurst, Oliff & Berridge

[57] ABSTRACT

An image-forming apparatus of a type which has an exposing device for forming latent images on a photosensitive medium, and a developing device for developing the latent images into a visible images. The photosensitive medium is supplied in the form of a web from a supply roll, along a feed path which extends through the exposing and developing devices. A shearing device is provided between the exposing and developing devices, to cut the web into cut sheets each of which has a predetermined length including an image-wise exposed length. After each cut sheet is parted from the web, the web is fed back until its leading cut end reaches the developing device, so that each portion of the web following the cut sheet can be used.

9 Claims, 4 Drawing Sheets

IMAGE-FORMING APPARATUS HAVING SHEARING DEVICE FOR CUTTING IMAGE-WISE EXPOSED PHOTOSENSITIVE WEB

BACKGROUND OF THE INVENTION

1. Field of the Invention

The present invention relates to improvements in an image-forming apparatus wherein a photosensitive medium is image-wise exposed to a radiation.

2. Discussion of the Prior Art

There is known an image-transfer or image-forming apparatus which has an exposing device for forming latent images on a photosensitive medium, and a developing device for developing the latent images into visible images. Usually, an electrostatically chargeable photosensitive paper or a pressure-sensitive photosensitive paper is used as the photosensitive medium. The electrostatically chargeable photosensitive paper includes an electroconductive base, and a photoconductive layer formed on one surface of the electroconductive base. The photoconductive layer contains as photoconductive material, for example, an inorganic pigment such as ZnO and $TiO_2$, which is dispersed in a binder resin. The pressure-sensitive photosensitive paper has a multiplicity of microcapsules whose hardness is changed upon exposure to a radiation. In a developing process, the microcapsules which have been softened or remain uncured after the exposing process are ruptured due to a pressure applied to the paper, so that a chromogenic material comes out of the ruptured microcapsules and reacts with a developer material, to form visible images corresponding to latent images that are formed on the paper in a prior exposing process wherein the microcapsules are image-wise exposed to a radiation.

In the case where the electrostatically chargeable photosensitive paper is used, its electrostatically chargeable surface must be protected against scratching, rubbing or friction, to insure a high quality of the visible images to be formed. The pressure-sensitive photosensitive paper is also sensitive to scratching, rubbing and friction, which may cause a reaction of the chromogenic material with the developer material. Where the photosensitive medium is supplied in the form of cut sheets superposed on each other in stack, a sheet feeding device for feeding the cut sheets one after another must be provided with suitable protective means for preventing the cut sheets from being scratched or rubbed or otherwise subjected to undesirable image-forming actions during a sheet feeding operation. Such protective means for avoiding deterioration of the visible images finally obtained on the cut sheets will inevitably lead to increased structural complexity and size of the sheet feeding device.

In the case where the photosensitive medium is provided in the form of a web wound as a roll, the web is fed with a reduced possibility of scratching, rubbing or other image-forming actions. Further, since the feeding device is not required to handle individual cut sheets, the feeding device can be comparatively simple in construction and small-sized.

In a known image-forming device using a feeding device adapted to feed a photosensitive medium in the form of a web from a supply roll, the photosensitive web is cut at a position downstream of the developing device, that is, after the exposed portion is developed. This arrangement suffers from a relatively low utilization ratio or yield of the photosensitive medium. Described more specifically, a developing toner has been deposited on the surface of an unexposed portion of the photosensitive web which has passed the developing device, more precisely, an unexposed portion between the developing device and a shearing device. If the pressure-sensitive photosensitive web is used, a reaction between the chromogenic material from the ruptured microcapsules and the developer material has been initiated on the unexposed portion of the web which has passed the developing device. Therefore, the unexposed portion which has been subjected to a developing process cannot be reused, and must be removed.

SUMMARY OF THE INVENTION

It is accordingly an object of the present invention to provide an image-forming apparatus which uses a photosensitive medium in the form of a web, and which permits an improved utilization ratio of the web, while maintaining a high quality of visible images formed on cut sheets of the web.

The above object may be achieved according to the principle of the present invention, which provides an image-forming apparatus of a type which has an exposing device for forming latent images on a photosensitive medium, and a developing device for developing the latent images into visible images, the apparatus including a medium-feeding device for feeding the photosensitive medium in the form of a web, from a supply roll, along a feed path which extends through the exposing device and the developing device, and a shearing device located between the exposing and developing devices, and operable for cutting the web into cut sheets each having a predetermined length which includes an image-wise exposed length.

In the image-forming apparatus of the present invention constructed as described above, a portion of the photosensitive web which is located upstream of the shearing device is not subjected to a developing process, since the shearing device to cut off the image-wise exposed portion of the web is located upstream of the developing device. This arrangement permits an increased yield of the photosensitive medium, i.e., an increased utilization ratio of the medium, because the non-exposed leading end portion of the photosensitive web can be reused by pulling this non-exposed leading end portion back to the exposing device after each image-wise exposed portion is parted from the web.

According to one feature of the invention, the photosensitive medium consists of a pressure-sensitive photosensitive medium which has a multiplicity of photosensitive micrcapsules. In this case, the developing device comprises presser rollers for pressed rolling contact with the cut sheets, to develop latent images formed on each of the cut sheets into visible images.

According to an alternative feature of the invention, the photosensitive medium consists of an electrostatically chargeable, photosensitive medium which includes an electroconductive base, and a photoconductive layer formed on the electroconductive base. In this case, the photoconductive layer is image-wise locally exposed by the exposing device upon exposure to a radiation, and the developing device comprises means for depositing a charged toner on charged areas of the each cut sheet.

In the case wherein the pressure-sensitive photosensitive medium is used, the image-forming apparatus of the invention may be adapted to comprise: (a) a supply roll consisting of the photosensitive medium in the form of a web; (b) a feeding device operable in a forward direction to feed the web along a feed path; (c) an exposing device disposed in the feed path, for image-wise exposing a portion of the photosensitive web fed from the supply roll, to form latent images on the image-wise exposed portion; (d) a developing device disposed in the feed path, at a position downstream of the exposing device, for applying a pressure to the exposed portion of the photosensitive web and thereby developing the latent images into visible images; (e) a shearing device disposed between the exposing and developing devices, for cutting the photosensitive medium into cut sheets each having a predetermined length which includes the image-wise exposed portion of the web; and (f) a control device for controlling the feeding, developing and shearing devices. The control device operates the feeding device in a reverse direction after the each cut sheet is parted from the photosensitive web by the shearing device, and thereby feeds the web in a direction from the shearing device toward the supply roll, until a leading cut end of the web reaches the exposing device.

In one preferred form of the above apparatus described above, the control device controls the feeding, exposing and shearing devices, such that the photosensitive web is fully non-image-wise exposed over a preset length following each the image-wise exposed portion, by the exposing device, and such that the each cut sheet is parted by the shearing device from the web at the fully non-image-wise exposed portion of the web. In this instance, the cutting operation effected before the developing step will not deteriorate the quality of the visible images obtained by the developing process.

In the case where an electrostatically chargeable, photosensitive medium is used, the image-forming apparatus of the invention may be adapted to comprise: (a) a supply roll consisting of the photosensitive medium in the form of a web; (b) a feeding device operable in a forward direction to feed the web along a feed path; (c) an exposing device disposed in the feed path, for image-wise exposing a portion of the photosensitive web fed from the supply roll, to form latent images on the image-wise exposed portion; (d) a developing device disposed in the feed path, at a position downstream of the exposing device, for depositing a charged ink material on the image-wise exposed portion of the photosensitive web and thereby developing the latent images into visible images; (e) a shearing device disposed between the exposing and developing devices, for cutting the photosensitive medium into cut sheets each having a predetermined length which includes the image-wise exposed portion of the web; and (f) a control device for controlling the feeding, exposing and developing devices. The control device operates the feeding device in a reverse direction after the each cut sheet is parted from the photosensitive web by the shearing device, and thereby feeds the web in a direction from the shearing device toward the supply roll, until a leading cut end of the web reaches the exposing device.

In one form of the apparatus described above, the control device controls the feeding, exposing and shearing devices, such that the photosensitive web is fully non-image wise exposed over a preset length following each the image-wise exposed portion, by the exposing device, and such that the each cut sheet is parted by the shearing device from the web at the fully non-image-wise exposed portion of the web. In this instance, too, the cutting operation effected before the developing step will not deteriorate the quality of the visible images obtained by the developing process.

BRIEF DESCRIPTION OF THE DRAWINGS

The foregoing and other objects, features and advantages of the present invention will become more apparent by reading the following detailed description of presently preferred embodiments of the invention, when considered in connection with the accompanying drawings, in which.

DETAILED DESCRIPTION OF THE PREFERRED EMBODIMENTS

Figure 1:
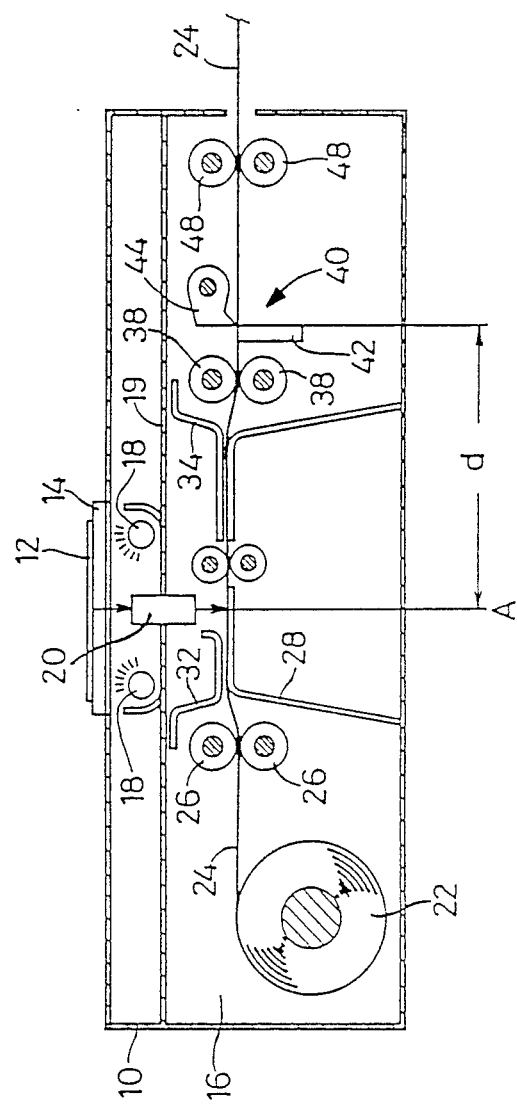
FIG. 1 is an front elevational view of one embodiment of an image-forming apparatus of this invention, with a front wall of its housing removed to show the interior of the apparatus.
Figure 2:
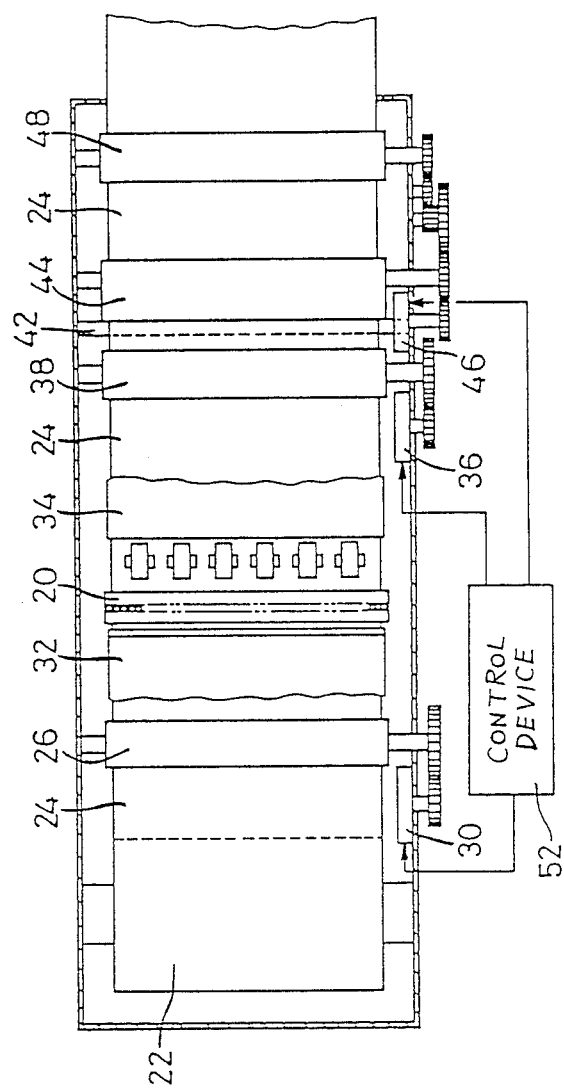
FIG. 2 is a plan view of the apparatus of FIG. 1, with a top wall of the housing and a top of its darkroom removed to show the interior of the darkroom.

Referring first to FIGS. 1 and 2, there is shown a box-like housing 10 of the image-forming apparatus constructed according to one embodiment of the invention. On the top wall of the housing 10, there is disposed a transparent support 14 on which an original 12 having images thereon is placed, such that the image-bearing surface is in contact with the support 14. The support 14 is adapted to be moved on the top wall of the housing 10 by a suitable driving device (not shown), at a desired rate. The housing 10 has a darkroom 16, a top wall 19 of which supports a light source in the form of a pair of parallel rod-like lamps 18 which extend in a direction perpendicular to a direction of movement of the support 14. The top wall 19 also supports a rod-lens array 20 such that the array 20 penetrates through the top wall 19 and is positioned between the pair of lamps 18. The lamps 18 are energized to illuminate the lower image-bearing surface of the original 12. A light beam reflected by the image-bearing surface of the original 12 is directed into the darkroom 16 through the rod-lens array 20. This array 20 consists of a multiplicity of optical fibers arranged in a row parallel to the lamps 18. Each optical fiber is capable of functioning as a convex lens, and has a comparatively large diameter. The upper ends of the optical fibers of the rod-lens array 20 are positioned opposite to the image-bearing surface of the original through the transparent support 14, so that the light rays reflected by the images are focused on a pressure-sensitive, photosensitive medium in the form of a web 24. The optical fibers are formed of a transparent glass, acrylic resin or other suitable material, such that the refractive index increases in the radially outward direction.

The photosensitive web 24 is supplied from a roll 22 which is rotatably supported in the darkroom 16, so that the web 24 is fed from the roll 22 by a pair of feed rollers 26, toward an exposure table 28. The feed rollers 26 and the exposure table 28 define a portion of a feed path along which the web 24 is fed toward a developing device (which will be described). The feed rollers 26 are rotated by a first drive motor 30 (FIG. 2). To guide the photosensitive web 24 on the exposure table 28 in a horizontal direction, the housing 10 is provided with an upstream guide plate 32 and a downstream guide plate 34, both fixed to the top wall 19. As the web 24 is fed between the upper surface of the exposure table 28 and the guide plates 32, 34, a portion of the web 24 which has passed the rod-lens array 20 is image-wise exposed by the light rays exiting from the lower end of the array 20. Thus, in the present embodiment, the lamps 18, rod-lens array 20, and exposure table 28 cooperate with other elements to provide an exposing device for image-wise exposing each portion of the photosensitive web to the reflected radiation from the image-bearing surface of the original 12, in order to form latent images on the exposed portion.

The image-wise exposed portion of the web 24 which has passed the exposure table 28 is advanced to a shearing device 40 by advancing rollers 38 which are driven by a second drive motor 36 (FIG. 2). The shearing device 40 includes a stationary cutter blade 42 secured to the housing 10, and a movable cutter blade 44 which is moved toward and away from the stationary blade 42 by a third drive motor 46 (FIG. 2), so that the exposed portion of the web 24 is cut off into a cut sheet, at its trailing end. At a position downstream of the shearing device 40 as viewed in the feeding direction of the web 24, there are provided a pair of presser rollers 48 which constitute the developing device indicated above. The presser rollers 48 are adapted to be rotated in pressed rolling contact with the image-wise exposed portion of the pressure-sensitive photosensitive web 24, namely, with the cut sheet parted from the web 24 by the shearing device 40. As illustrated in FIG. 2, a control device 52 constituted by a so-called microcomputer is provided to control the drive motor (not shown) to move the support 14, the first drive motor 30 to rotate the feed rollers 26, the second drive motor 36 to rotate the advancing rollers 38, and the third drive motor 46 to activate the shearing device 40. Stepping motors are used for these drive motors.

The photosensitive web 24 of a pressure-sensitive type used in the present embodiment includes a multiplicity of radiation-sensitive microcapsules which are softened, or cured or hardened, upon exposure to a radiation. The softened or uncured microcapsules are ruptured while the web 24 is passed through the pressure nip of the presser rollers 48, so that visible images are formed as a result of a chemical reaction between the chromogenic material which flows from the ruptured microcapsules, and a developer material. The developer material is either provided on the photosensitive web 24, or on a separate developer sheet which is superposed on the exposed portion of the web 24 (which has been cut as a cut sheet by the shearing device 40), before the developer sheet and the cut sheet are passed through the nip of the presser rollers 48. Thus, the latent images formed on the image-wise exposed portion of the web 24 are developed into visible images on the cut sheet.

The operation of the thus constructed instant image-forming apparatus is controlled by the control device 52 in the following manner:

Upon activation of a suitable start switch (not shown), the photosensitive web 24 is continuously fed while at the same time the support 14 is moved in the direction parallel to the feeding direction of the web 24. As a result, the images on the image-bearing surface of the original 12 on the moving support 14 are optically transferred as latent images on the photosensitive web 24, at an exposure point A (indicated in FIG. 1) right below the rod-lens array 20. Namely, a portion of the photosensitive web 24 corresponding to the original 12 is image-wise exposed to the light rays reflected by the image-bearing surface of the original 12. The photosensitive web 24 is fed until the trailing end of the image-wise exposed portion of the web 24 has been moved just past the shearing device 40. Then, the feeding and advancing rollers 26, 38 are stopped, and the shearing device 40 is activated to cut the web 24 at the trailing end of the image-wise exposed portion, whereby the exposed portion is parted as a cut sheet separated from the remainder of the web 24. The cut sheet is fed past the pressure nip of the presser rollers 48, whereby the latent images are developed into visible images as described above. After the shearing device 40 has been activated to cut off the exposed portion of the web 24, the feed rollers 26 and the advancing rollers 38 are rotated in the reverse direction to feed the web 24 in the backward direction, until the leading cut end of the web 24 is moved back to the exposure point A. In other words, the web 24 is fed back by a distance d which is equal to an unexposed length of the web 24 between the shearing device 40 and the exposure point A. According to this arrangement, this unexposed length of the web 24 which has been pulled back from the shearing device 40 can be reused. That is, the next image-forming cycle can be started at the leading end of the web 24 which defines the trailing end of the exposed portion in the last cycle. Thus, no length of the photosensitive web 24 is wasted.

In the image-forming apparatus described above, the photosensitive medium is supplied continuously in the form of the continuous web 24 from the supply roll 22. Consequently, the medium feeding device used in the present embodiment can be simplified in construction and small-sized, as compared with a feeding device which is adpated to feed cut sheets one after another and which requires various protective means for preventing the cut sheets from being scratched, rubbed or otherwise subjected to a frictional action during a sheet feeding operation, to thereby avoid resulting deterioration of the finally obtained visible images.

Further, since the shearing device 40 is positioned between the exposure point A and the presser rollers 48 so as to cut the web 24 at the trailing end of the image-wise exposed portion, the unexposed portion of the web 24 between the shearing device 40 and the exposure point A is not subjected to a developing pressure by the presser rollers 48. Therefore, it is not necessary to remove this unexposed portion of the web 24 which follows each image-wise exposed portion that is parted from the web 24 as a cut sheet in each image-forming cycle. Thus, the utilization ratio of the photosensitive web 24 can be considerably improved.

Moreover, since the cutting operation by the shearing device 40 is conducted after the photosensitive web 24 has been exposed, the microcapsules in a portion of the web 24 to which a shearing pressure is applied will not be easily ruptured, and consequently the trailing end of the cut sheet will not be undesirably imaged or blurred due to the shearing pressure. More specifically, the trailing end of the exposed portion of the web 24 is usually a non-imaged area, and therefore the microcapsules in that non-imaged area are cured by exposure to the reflected light beam.

Another embodiment of the invention will be described next, referring to FIGS. 3 and 4. In the interest of brevity and simplification, the same reference numerals as used in FIGS. 1 and 2 will be used in FIGS. 3 and 4 to identify the corresponding components.

In the preceding embodiment which uses the pressure-sensitive photosensitive web 24 having radiation-curable microcapsules, latent images formed by selective image-wise curing of the microcapsules are developed into visible images by applying a pressure to the image-wise exposed portion of the web 24. However, the present modified image-forming apparatus is adapted to use an electrostatically chargeable photosensitive web 60, in place of the photosensitive web 24 of a pressure-sensitive type. The photosensitive web 60 includes an electroconductive base, and a photoconductive layer formed on the electroconductive base. The photoconductive layer contains a photoconductive material such as ZnO, $TiO_2$ or other inorganic pigment, which is dispersed in a binder resin. The photoconductive layer is electrostatically charged over the entire surface area before it is image-wise exposed to a radiation reflected by the original 12. Since the electric conductivity of the photoconductive layer is locally changed depending upon an amount of the radiation to which the local areas of the layer are exposed. For example, the exposed local areas of the photoconductive layer have a lower electrical resistance value than the unexposed local areas. Thus, the pre-charged photoconductive layer is image-wise exposed with local elimination of the electric charge, so that latent images are electrostatically formed on the photosensitive web 60.

Figure 3:
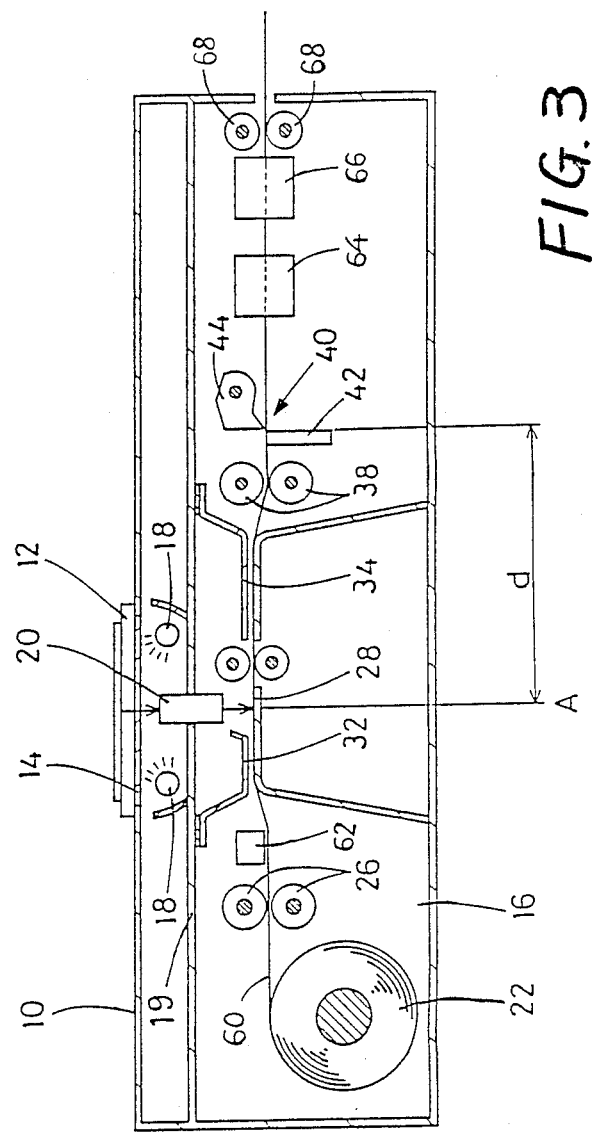
FIGS. 3 and 4 are views corresponding to those of FIGS. 1 and 2, showing another embodiment of the invention.
Figure 4:
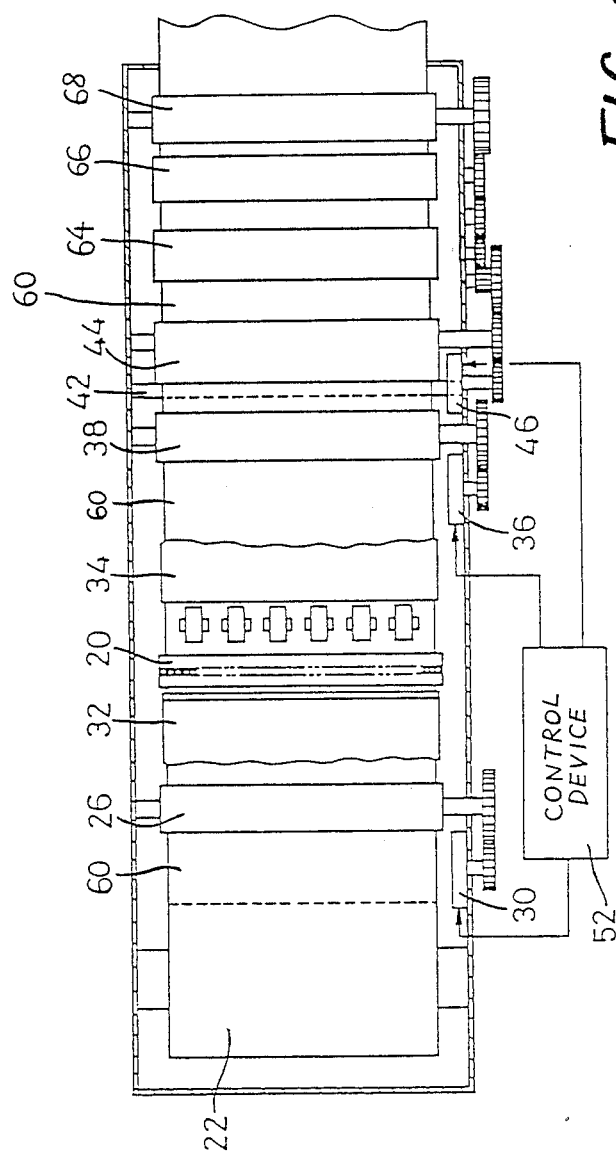

As shown in FIG. 3, the electrostatically chargeable photosensitive web 60 fed from the roll 22 by the feed rollers 26 is electrostatically charged over the entire surface area by a charger 62. The thus pre-charged photosensitive web 60 is image-wise exposed, and the exposed portion is separated as a cut sheet from the web 60 by the shearing device 40 as in the preceding embodiment. The cut sheet is then passed through a developing device 64, by which a charged colored toner dispersed as an ink material in an electrically insulating medium is deposited on the charged areas on the cut sheet, whereby the latent images are developed into visible images. The thus formed visible images are then fixed while the cut sheet is fed through a fixing device 66. The cut sheet is discharged out of the apparatus by feed rollers 68.

After the photosensitive web 60 is cut at the trailing end of the image-wise exposed portion, the control device 52 activates the drive motors 30, 36 in the reverse direction to reverse the feed and advancing rollers 26, 38, for pulling back the photosensitive web 60 by a distance d equal to the unexposed length between the shearing device 40 and the exposure point A. Hence, the present embodiment also permits a reduced possibility of scratching or rubbing of the photosensitive web 60 during a feeding operation, and makes it possible to use a simplified and small-sized feeding device, as compared with a feeding device for feeding cut sheets one after another. Futher, the unexposed portion of the web 60 located between the shearing device 40 and the exposure point A when the exposed portion is cut off is not subjected to a developing process by the developing device 64, and consequently can be reused. Accordingly, the instant embodiment also enjoys a high utilization ratio of the photosensitive web 60.

In the case where the trailing end portion of the cut sheet includes an imaged area, this end portion may possibly be blurred to a slight extent due to a pressure applied upon shearing of the web 24, 60 even in the illustrated embodiments. Such a possibility may be eliminated by modifying a control program that is executed by the control device 52. Stated in greater detail, the control device 52 may be adapted to control the feeding, exposing and shearing devices, such that the photosensitive web 24, 60 is fully non-image-wise exposed by the exposing device, over a preset length following the trailing end of each image-wise exposed portion. In this case, the web 24, 60 is sheared by the shearing device 40 at the fully non-image-wise exposed portion following the image-wise exposed portion. The photosensitive web 24, 60 may be given such a fully non-image-wise exposed portion, by an opaque or reflector strip which has a width equal to the preset length indicated above and which is provided at one end of the support 14 corresponding to the end of the original 12 which corresponds to the trailing end of each image-wise exposed portion of the web 24, 60. The opaque or reflector strip reflects the radiation from the light source 18, and the reflected radiation fully non-image-wise exposes the preset length of the web which follows the image-wise exposed portion corresponding to the original 12.

While the present invention has been described in its presently preferred embodiments, it is well understood that it is within the skill of the art to make various changes, modifications and improvements in the present invention, without changing the spirit and scope of the invention defined in the following claims.

What is claimed is:

1. An image-forming apparatus, comprising:
   an exposing device for forming latent images on a pressure-sensitive photosensitive medium in the form of a web having a multiplicity of photosensitive microcapsules;
   a developing device comprising presser rolls for pressed rolling contact with the photosensitive medium, to develop the latent images into visible images, comprising:
   a medium-feeding device for feeding the web of said pressure-sensitive photosensitive medium, from a supply roll, along a feed path which extends through said exposing device and said developing device; and
   a shearing device located between said exposing device and said developing device, and operable for cutting said web into cut sheets each having a predetermined length which includes an image-wise exposed length.

2. An image-forming apparatus, comprising:
   an exposing device for forming latent images on an electrostatically chargeable photosensitive medium in the form of a web which includes an electroconductive base, and a photoconductive layer formed on said electroconductive base, said exposing device image-wise locally exposing said photoconductive layer to a radiation to form charged and non-charged areas on said photoconductive layer and thereby form said latent images;
   a developing device comprising means for depositing a charged toner on the charged areas of said photoconductive layer of said photosensitive medium, to develop the latent images into visible images;
   a medium-feeding device for feeding the web of said electrostatically chargeable photosensitive medium, from a supply roll, along a feed path which extends through said exposing device and said developing device; and a shearing device located between said exposing device and said developing device, and operable for cutting said web into cut sheets each having a predetermined length which includes an image-wise exposed length.

3. An image-forming apparatus, comprising:

a supply roll consisting of a pressure-sensitive photosensitive medium in the form of a web having a multiplicity of photosensitive microcapsules;

a feeding device operable in a forward direction to feed said web along a feed path;

an exposing device disposed in said feed path, for image-wise exposing a portion of said photosensitive web fed from said supply roll, to form latent images on the image-wise exposed portion;

a developing device disposed in said feed path, at a position downstream of said exposing device, for applying a pressure to said exposed portion of said photosensitive web and thereby developing said latent images into visible images; and a control device for operating said feeding device in said forward direction to feed said portion of the photosensitive web through said exposing device and said developing device, and then operating said feeding device in a reverse direction after the forward feeding operation of said web, thereby feeding said web from said developing device toward said exposing device such that a leading end of an unexposed portion of said web reaches said exposing device.

4. An image-forming apparatus according to claim 3, wherein each of said multiplicity of microcapsules contains a chromogenic material, and said photosensitive web further has a developer material which is capable of chemically reacting with said chromogenic material, when said microcapsules are ruptured by said developing device.

5. An image-forming apparatus according to claim 3, wherein each of said multiplicity of microcapsules contains a chromogenic material, and said exposed portion of said photosensitive web is pressed by said developing material capable of chemically reacting with said chromogenic material when said microcapsules are ruptured by said developing device.

6. An image-forming apparatus for forming images on a pressure-sensitive photosensitive medium, comprising:

a supply roll consisting of said photosensitive medium in the form of a web;

a feeding device operable in a forward direction to feed said web along a feed path;

an exposing device disposed in said feed path, for image-wise exposing a portion of said photosensitive web fed from said supply roll, to form latent images on the image-wise exposed portion;

a developing device disposed in said feed path, at a position downstream of said exposing device, for applying a pressure to said exposed portion of said photosensitive web and thereby developing said latent images into visible images;

a shearing device disposed between said exposing and developing devices, for cutting said photosensitive medium into cut sheets each having a predetermined length which includes said image-wise exposed portion of the web; and a control device for operating said feeding device in a reverse direction after said each cut sheet is parted from said photosensitive web by said shearing device, and thereby feeding said web in a direction from said shearing device toward said supply roll, until a leading cut end of said web reaches said exposing device.

7. An image-forming apparatus according to claim 6, wherein said control device controls said feeding, exposing and shearing devices, such that said photosensitive web is fully non-image-wise exposed over a preset length following each said image-wise exposed portion, by said exposing device, and such that said each cut sheet is parted by said shearing device from said web at the fully non-image-wise exposed portion of the web.

8. An image-forming apparatus for forming images on an electrostatically chargeable, photosensitive medium, comprising:

a supply roll consisting of said photosensitive medium in the form of web;

a feeding device operable in a forward direction to feed said web along a feed path;

an exposing device disposed in said feed path, for image-wise exposing a portion of said photosensitive web fed from said supply roll, to form latent images on the image-wise exposed portion;

a developing device disposed in said feed path, at a position downstream of said exposing device, for depositing a charged ink material on the image-wise exposed portion of said photosensitive web and thereby developing said latent images into visible images;

a shearing device disposed between said exposing and developing devices, for cutting said photosensitive medium into cut sheets each having a predetermined length which includes said image-wise exposed portion of the web; and a control device for operating said feeding device in a reverse direction after said each cut sheet is parted from said photosensitive web by said shearing device, and thereby feeding said web in a direction from said shearing device toward said supply roll, until a leading cut end of said web reaches said exposing device.

9. An image-forming apparatus according to claim 8, wherein said control device controls said feeding, exposing and shearing devices, such that said photosensitive web is fully non-image-wise exposed over a preset length following each said image-wise exposed portion, by said exposing device, and such that said each cut sheet is parted by said shearing device from said web at the fully non-image-wise exposed portion of the web.

* * * * *